(12) United States Patent
Leiers

(10) Patent No.: US 12,320,002 B2
(45) Date of Patent: Jun. 3, 2025

(54) CVD REACTOR AND METHOD FOR CONTROLLING THE SURFACE TEMPERATURE OF THE SUBSTRATES

(71) Applicant: AIXTRON SE, Herzogenrath (DE)

(72) Inventor: Ralf Leiers, Mönchengladbach (DE)

(73) Assignee: AIXTRON SE, Herzogenrath (DE)

( * ) Notice: Subject to any disclaimer, the term of this patent is extended or adjusted under 35 U.S.C. 154(b) by 247 days.

(21) Appl. No.: 17/789,448

(22) PCT Filed: Jan. 5, 2021

(86) PCT No.: PCT/EP2021/050037
§ 371 (c)(1),
(2) Date: Jun. 27, 2022

(87) PCT Pub. No.: WO2021/140078
PCT Pub. Date: Jul. 15, 2021

(65) Prior Publication Data
US 2023/0041558 A1 Feb. 9, 2023

(30) Foreign Application Priority Data
Jan. 10, 2020 (DE) ..................... 10 2020 100 481.8

(51) Int. Cl.
*C23C 16/52* (2006.01)
*C23C 16/458* (2006.01)

(52) U.S. Cl.
CPC ...... *C23C 16/4586* (2013.01); *C23C 16/4584* (2013.01); *C23C 16/52* (2013.01)

(58) Field of Classification Search
None
See application file for complete search history.

(56) References Cited

U.S. PATENT DOCUMENTS

2003/0233768 A1* 12/2003 Kaeppeler ............. C30B 25/165
34/560

FOREIGN PATENT DOCUMENTS

DE 10 056 029 A1 5/2002
DE 10 2015 100 640 A1 7/2016
(Continued)

OTHER PUBLICATIONS

International Search Report mailed May 3, 2021, from the ISA/European Patent Office, for International Patent Application No. PCT/EP2021/050037 (filed Jan. 5, 2021), 8 pgs.
(Continued)

*Primary Examiner* — David P Turocy
(74) *Attorney, Agent, or Firm* — Ascenda Law Group, PC

(57) ABSTRACT

In a CVD reactor and a method for the open-loop/closed-loop control of the surface temperature of substrates arranged therein, the substrates lie on substrate-retaining elements, which are each supported by a gas cushion. Actual values of the surface temperatures associated with a respective substrate-retaining element are successively measured and the surface temperatures are controlled in a closed-loop manner to a common value by varying the gas cushion height. After measuring each actual value of the surface temperature associated with a substrate-retaining element and using only the respective last-measured actual value of the surface temperatures of each substrate-retaining element, a first average value is calculated, a difference value associated with the substrate-retaining element is calculated, and an approximate actual value is calculated for each of the other substrate-retaining elements by adding the associated difference value to the first average value, said approximate actual value being used for the open-loop/closed-loop control.

7 Claims, 5 Drawing Sheets

(56) References Cited

FOREIGN PATENT DOCUMENTS

| | | | | |
|---|---|---|---|---|
| DE | 102018125531 A1 * | 4/2020 | ......... | C23C 16/4584 |
| EP | 1 335 997 B1 | 6/2005 | | |
| EP | 2495755 A1 * | 9/2012 | ............. | C23C 16/46 |

OTHER PUBLICATIONS

Written Opinion mailed May 3, 2021, from the ISA/European Patent Office, for International Patent Application No. PCT/EP2021/050037 (filed Jan. 5, 2021), 15 pgs.
International Preliminary Report on Patentability issued Jul. 12, 2022, from the International Bureau of WIPO, for International Patent Application No. PCT/EP2021/050037 (filed Jan. 5, 2021), 38 pgs.
Written Opinion mailed May 3, 2021, from the ISA/European Patent Office, for International Patent Application No. PCT/EP2021/050037 (filed Jan. 5, 2021), English translation, 21 pgs.

* cited by examiner

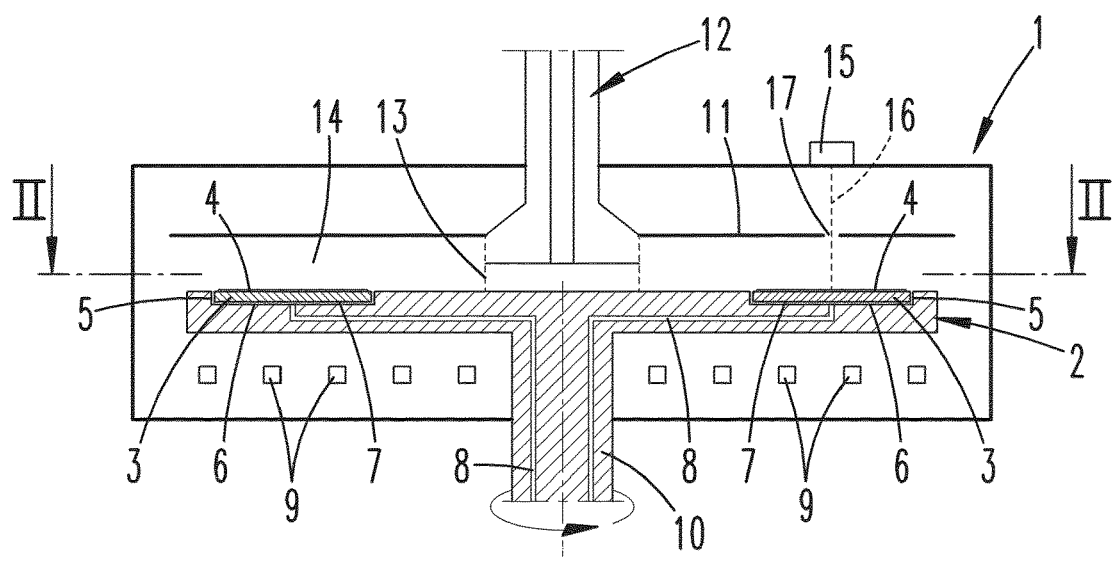
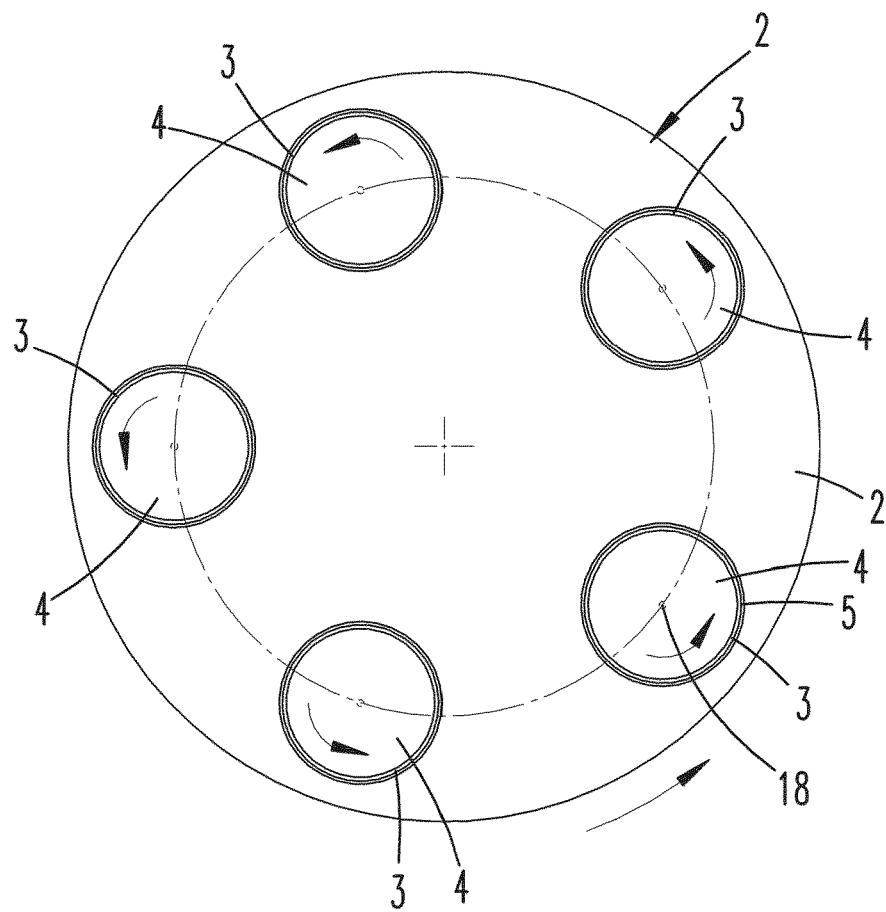

Fig. 6

| | ST | MT | $T_1$ / $dT_1$ / $T_1'$ | $T_2$ / $dT_2$ / $T_2'$ | $T_3$ / $dT_3$ / $T_3'$ | $T_4$ / $dT_4$ / $T_4'$ | $T_5$ / $dT_5$ / $T_5'$ | MT' | n |
|---|---|---|---|---|---|---|---|---|---|
| A | 900 | 900 | 900 / 0 / | 902 / +2 / | 898 / -2 / | 901 / +1 / | 899 / -1 / | 900 | 0 |
| B ↓ | 901 | 900,2 | 901 / +0,8 / | / / 902,2 | / / 898,2 | / / 901,2 | / / 899,2 | 900,36 | 1 |
| | 902 | 900,6 | / / 901,4 | 904 / +3,4 / | / / 898,6 | / / 901,6 | / / 899,6 | 901,04 | 2 |
| | 903 | 901,2 | / / 902 | / / 904,6 | 901 / -0,2 / | / / 902,2 | / / 900,2 | 902 | 3 |
| | 904 | 902 | / / 902,8 | / / 905,4 | / / 901,8 | 905 / +3 / | / / 901 | 903,2 | 4 |
| | 905 | 903 | / / 903,8 | / / 906,4 | / / 902,8 | 904 / +1 / 906 | / / 904,6 | | 5 |
| | 906 | 904 | 906 / +2 / | / / 907,4 | / / 903,8 | / / 907 | / / 905 | 905,84 | 6 |
| | 907 | 905 | / / 907 | 909 / +4 / | / / 904,8 | / / 908 | / / 906 | 906,96 | 7 |
| | 908 | 906 | / / 908 | / / 910 | 906 / 0 / | / / 909 | / / 907 | 908 | 8 |
| | 909 | 907 | / / 909 | / / 911 | / / 907 | 910 / +3 / 908 | / / 909 | | 9 |
| | 910 | 912 | / / 908 | / / 912 | / / 908 | / / 911 | 909 / +1 / 910 | | 10 |

CVD REACTOR AND METHOD FOR CONTROLLING THE SURFACE TEMPERATURE OF THE SUBSTRATES

RELATED APPLICATIONS

This application is a National Stage under 35 USC 371 of and claims priority to International Application No. PCT/EP2021/050037, filed 5 Jan. 2021, which claims the priority benefit of DE Application No. 10 2020 100 481.8, filed 10 Jan. 2020.

FIELD OF THE INVENTION

The invention pertains to a method for the open-loop/closed-loop control of the surface temperature of substrates, which lie on substrate retaining elements associated with a susceptor in a process chamber of a CVD reactor, wherein actual values of the surface temperatures associated with a respective substrate retaining element are successively measured and the surface temperatures are controlled to a common value in a closed-loop manner by varying a parameter. The parameter may be the height of a gas cushion, particularly a dynamic gas cushion, that supports a substrate retainer forming the substrate retaining element. The parameter may also be the composition of a gas flow forming the gas cushion.

The invention furthermore pertains to a device for carrying out the method in the form of a CVD reactor with a number of substrate retaining elements, which are associated with a susceptor and may be respectively formed by a substrate retainer supported by a dynamic gas cushion, wherein the susceptor can be displaced in such a way that the substrate retaining elements can be successively moved into a detection area of a temperature measuring element, by means of which a respective surface temperature of a substrate lying on the substrate retaining element can be successively determined, and wherein the surface temperatures are controlled to a common value in a closed-loop manner by varying the height of the gas cushion with a first closed-loop controller formed by a control device.

BACKGROUND

EP 1 335 997 B1 describes a method for the open-loop/closed-loop control of the surface temperature of multiple substrate retaining elements, wherein each of the multiple substrate retaining elements lies in an upwardly open pocket of the susceptor. A gas flow being introduced into the bottom of the pocket lifts the substrate retaining element lying in the pocket and sets the substrate retaining element in rotation. The susceptor can be heated to a susceptor temperature by means of a heating device located underneath the susceptor. A process chamber is located above the susceptor and upwardly delimited by a process chamber ceiling. An optical path of an optical temperature measuring element such as a pyrometer extends through an opening located in the process chamber ceiling. The susceptor is driven by a rotary drive with a rotational speed of approximately 5 revolutions per minute. Five substrate retaining elements are located on the susceptor such that the same substrate retaining element only lies underneath the temperature measuring element, by means of which the surface temperature of the substrate retaining element or a substrate carried by the substrate retaining element is measured, every 12 seconds. Average values are formed of the surface temperatures measured at intervals. A vertical temperature gradient is formed within the CVD reactor from the heating device to the process chamber ceiling via the susceptor. Due to the gas cushion, heat flows from the susceptor to the substrate retaining element and onward to the substrate. The height of the gas cushion influences the heat transfer and therefore the temperature of the substrate. A closed-loop controller or a control device can control the substrate temperature toward the average value in such a way that the difference of the substrate temperature from the average value is nearly zero by individually varying the height of the gas cushion of each substrate retaining element. However, this method only allows such a closed-loop control of the surface temperature if the susceptor temperature is constant over time. The utilization of the closed-loop control algorithm used in the prior art fails due to the significantly changing temperatures of a temperature ramp and because only actual values from the past are available for the closed-loop control.

SUMMARY OF THE INVENTION

The invention is based on the objective of respectively enhancing the initially described CVD reactor and the initially described method to the effect that the closed-loop control of the surface temperature can also take place over a time, during which the susceptor temperature changes.

This objective is attained with the invention specified in the claims, wherein the dependent claims not only represent advantageous enhancements of the invention specified in the independent claims, but also represent independent solutions of the objective.

The invention first and foremost proposes that an approximated actual value for a previously measured substrate retaining element is respectively calculated or estimated by using the last-measured actual value of the surface temperature of a substrate retaining element. This is realized by forming a difference of the currently measured actual value from another value. A difference value associated with the substrate retaining element is calculated by forming this difference. The other value is suitably estimated. The other value preferably is determined by means of an average value formation. In this context, it is particularly proposed that only one measured actual value of each substrate retaining element is respectively used in the average value formation, wherein the term measured actual value also refers to an actual value formed by averaging a plurality of individual measurements that, however, have taken place in immediate succession on the same substrate retaining element. According to the invention, the average value formation is carried out by only using actual values that were measured at a point in time that is shorter than the period of revolution of a circular disk-shaped susceptor, on which the multiple substrate retaining elements are arranged on a circular arc line about its center. According to the invention, only the last-measured actual values of each substrate retaining element are therefore used for the average value formation. According to the invention, difference values are calculated. An average value and a difference value are calculated during each measurement of an actual value. The difference value is the difference of the actual value measured during the measurement from the calculated average value. According to the invention, the current temperature of a substrate retaining element is measured as the actual value while the substrate retaining element passes through the detection area of a temperature measuring element and the average value and the difference value associated with the substrate retaining element are calculated from this measured actual value and only the actual values of the other substrate retaining elements, which were determined in the most recent past. Consequently, an actual value, the average value and the difference value associated with a substrate retaining element are updated each time the substrate retaining element passes through the detection area of the temperature measuring element. According to the invention, an approximated actual value furthermore is calculated from the average value and the difference values of the other substrate retaining elements, which were determined in the most recent past, each time a substrate retaining element passes through the detection area of the temperature measuring element. The currently determined actual value and the approximated actual values are used for the open-loop/closed-loop control of the surface temperatures. The substrate retaining element may be formed by a storage space of the susceptor that is designed, for example, in the form of a depression. In this case, the substrate retaining element may be an integral or materially uniform component of the substrate retainer. However, the invention preferably also includes exemplary embodiments, in which the substrate retaining element is a substrate retainer that is supported by a dynamic gas cushion and on which a substrate can lie. For example, a first closed-loop controller that generates a control value for a mass flow controller may be used for the open-loop/closed-loop control of the surface temperature, wherein said control value serves for adjusting the mass flow of the gas that forms the gas cushion. The height of the gas cushion can be varied by varying the mass flow of the gas. To this end, a mass flow controller is individually assigned to each gas cushion. However, the invention also pertains to design variations, in which the parameter is a cooling power or heating power. If the currently measured actual value is for the sake of simplicity also referred to as approximated actual value because its difference from the average value corresponds to the current difference value, a second average value can be obtained from all approximated actual values. Consequently, the current actual value, which was measured on the substrate retaining element lying in the detection area of the temperature measuring element, and the most recent approximated actual values, which were last measured on the other substrate retaining elements, are used for forming the second average value. The two average values essentially correspond to a process temperature if the method is carried out at an essentially constant susceptor temperature. Consequently, not only a temperature measured directly on the susceptor with a separate measuring device can be used for a closed-loop control of the susceptor temperature, but also one of the two average values. The method according to the invention is particularly advantageous for instances, in which the susceptor temperature changes, for example between two coating steps, in which layers, for example, of a semiconductor material are deposited on the substrate at different temperatures. In this case, the susceptor temperature is increased or decreased in the form of a ramp. This may take place with or without closed-loop control. Heating or cooling of the susceptor preferably is controlled in a closed-loop manner such that the temperature changes with a constant rate of change over time. In the application of the above-described method, temperature values that were measured at different times and therefore also at different susceptor temperatures are used for the average value formation of the first average value. The current temperature of a substrate retaining element can be estimated as an approximated actual value by means of the difference values updated during each measurement and the last-measured temperature of the substrate retaining element. This estimated value can be fed to the closed-loop controller as an actual value such that the closed-loop control of the surface temperatures of the substrate retaining elements does not have to be interrupted or the parameters of the closed-loop control do not have to be changed during a change of the process temperature, which is adjusted by means of the susceptor temperature. The second average value approximately corresponds to the current susceptor temperature whereas the first average value lags behind the change of the susceptor temperature, i.e. the first average value is lower than the susceptor temperature while heating up and greater than the susceptor temperature while cooling down. The closed-loop control algorithm used so far can also use the approximated actual values as actual values on a temperature ramp. They lie closer to the actual surface temperatures of the substrate retaining elements than the "old" actual value used for the closed-loop control in the past.

The CVD reactor, according to the invention, has a susceptor that may have the shape of a circular disk and can be rotationally driven about an axis of rotation. The susceptor has substrate retaining elements such as pockets or other storage spaces for storing a plurality of substrate retaining elements on its upper side that faces the process chamber, wherein said substrate retaining elements are respectively supported by a gas cushion formed by a gas flow that can be specified by a mass flow controller. During the rotation of the susceptor, one substrate retaining element after the other travels through the detection area of a temperature measuring element that may be realized in the form of an optical sensor such as a pyrometer or a photodiode. A control device of the CVD reactor is programmable. It is programmed in such a way that the above-described method is used for the closed-loop control of the surface temperatures of the substrate retaining elements or of the substrates lying on the substrate retaining elements. The heating device may be an infrared heater or an RF heater.

The method and the device according to the invention are not only suitable for an operation, in which all substrate retaining elements are occupied by substrates to be coated. The method is also suitable for instances, in which the total number of substrate retaining elements is only partially occupied by substrates. For example, only one or only a few substrate retaining elements may be respectively occupied by substrates in a test phase. The remaining substrate retaining elements may not be occupied by any substrates. However, they are preferably occupied by dummy substrates such as old, used substrates. In this variation of the invention, the average value may be formed of all measured surface temperatures. However, it may also be formed of only the surface temperatures of a few substrates, for example the substrates used for test purposes. A second average value can also be calculated in this variation. This average value preferably is formed exclusively of the approximated actual values of the substrates used for test purposes. In the simplest case, in which only one substrate used for test purposes should be coated in the CVD reactor, the second average value may be the calculated approximated actual value of the single test substrate. The parameter, the variation of which makes it possible to influence the temperature of the substrate, may be the height of the gas cushion. However, the parameter may also be a composition of the gas forming the gas cushion, for example, if this gas is a mixture of a gas with high thermal conductivity and a gas with low thermal conductivity. It would furthermore be possible that the substrate retaining elements can be individually tempered (e.g., individually cooled or heated). In this case, the parameter may be a cooling power or a heating power. Individual heating may be realized, for example, by means of a laser beam.

The invention particularly pertains to a method for the open-loop/closed-loop control of the surface temperature of substrates, which lie on respective substrate retaining elements associated with a susceptor in a process chamber of a CVD reactor, wherein actual values of the surface temperatures associated with a respective substrate retaining element are successively measured and the surface temperatures are controlled to a common value in a closed-loop manner by varying a parameter (e.g., the height of a gas cushion that supports a substrate retainer forming the substrate retaining element), wherein a first average value is calculated after each measurement of a measured actual value of the surface temperature associated with a substrate retaining element by respectively using only the last-measured actual value of the surface temperature of each substrate retaining element, wherein a difference value associated with the substrate retaining element is calculated by forming a difference of the actual value measured during the measurement and the first average value, and wherein an approximated actual value, which is used for the open-loop/closed-loop control, is respectively calculated for each of the other substrate retaining elements by adding the associated difference value to the first average value.

BRIEF DESCRIPTION OF THE DRAWINGS

An exemplary embodiment of the invention is described in greater detail below with reference to the attached drawings. In these drawings:

FIG. 1 schematically shows a cross section of a CVD reactor according to the invention, wherein the CVD reactor has a plurality of substrate retaining elements that are designed in the form of substrate retainers 3, FIG. 2 schematically shows a top view of a susceptor 2 of the CVD reactor approximately along the line of section II-II in FIG. 1, wherein said susceptor has five storage spaces, in which a substrate retaining element 3 carrying a substrate 4 is respectively arranged, FIG. 3 schematically shows the mass flow controllers 20 for respectively making available a gas flow that is fed into supply lines 8 of the susceptor 2 in order to form a gas cushion 7, on which the substrate retaining element 3 lies and by means of which the substrate retaining element 3 is set in rotation, FIG. 4 schematically shows the progression of the surface temperatures T1, T2, T3, T4, T5 of the five substrate retaining elements 3 when the substrate temperature is essentially kept constant in a first phase A and when the substrate temperature is increased with a constant gradient over time in a second phase B, FIG. 6 shows a table of the surface temperatures (measured actual values) T1, T2, T3, T4, T5 measured in intervals n during an increase of the substrate temperature ST, the average values MT and MT' formed thereof, as well as difference values dT1, dT2, dT3, dT4, dT5 calculated therefrom and approximated actual values T1', T2', T3', T4', T5' calculated therefrom.

DETAILED DESCRIPTION

Figure 3:
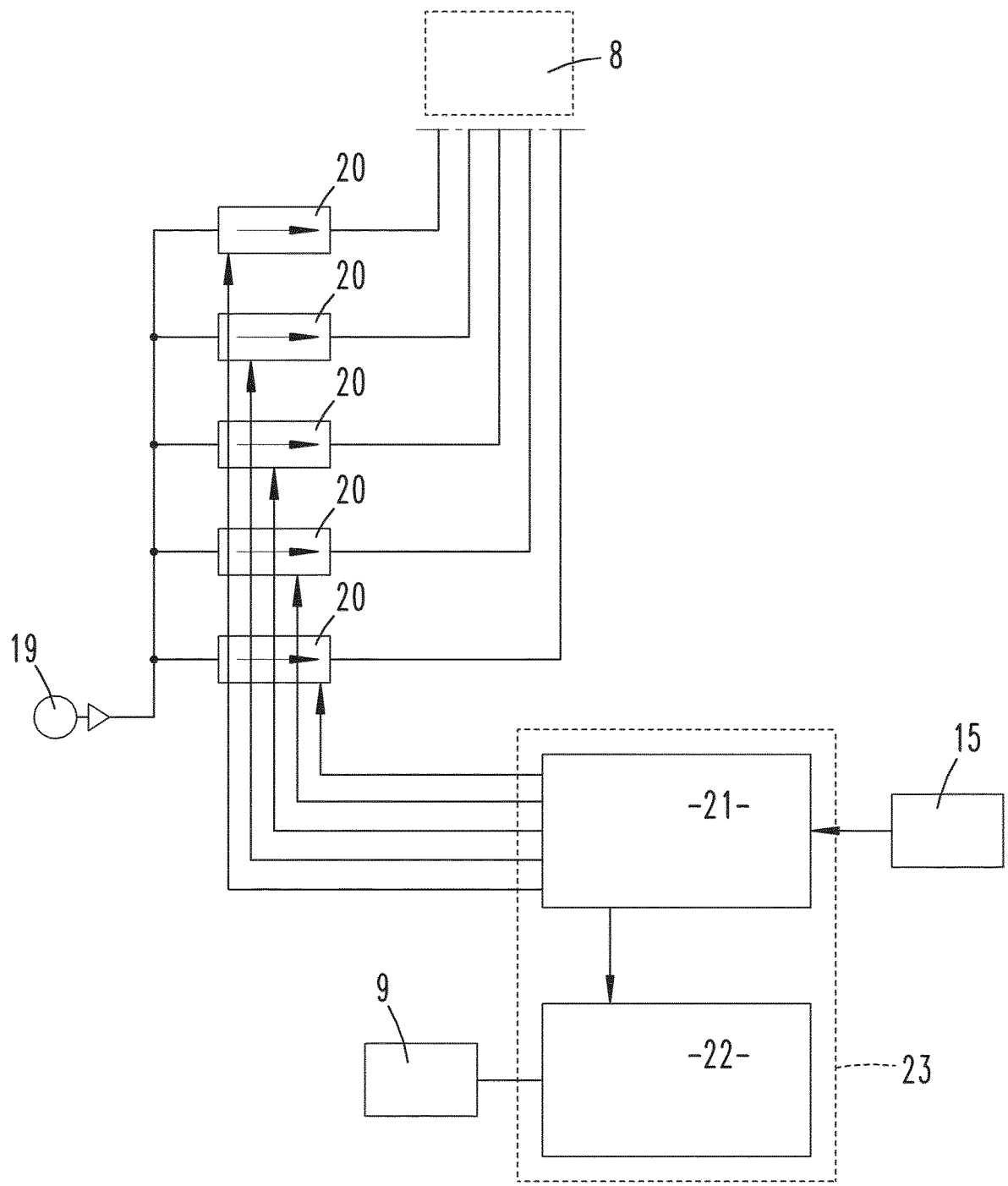

The CVD reactor illustrated in FIGS. 1 and 2 has an outwardly gas-tight housing 1. A susceptor 2 that has the shape of a circular disk and consists, for example, of graphite or coated graphite is located within the housing 1. A heating device 9 is located underneath the susceptor 2 and serves for heating the susceptor 2 to a susceptor temperature ST. The susceptor 2 is carried by a shaft 10 that can be rotated about an axis. Supply lines 8 extend within the shaft 10 and are fed by mass flow controllers 20. Each of the altogether five supply lines is fed by a mass flow controller 20, wherein the mass flow controller 20 is supplied with an inert gas such as hydrogen or nitrogen or a noble gas by a gas source 19. Five storage spaces, each for storing a substrate 4, are located in an upper side of the susceptor 2 that is directed toward the process chamber. The storage spaces are respectively formed by a substrate retaining element 3. It is possible to form these substrate retaining elements 3 using the same material as the susceptor 2, in which case the substrate retaining elements 3 may take the form of depressions within the susceptor 2, each for accommodating a substrate 4.

In the exemplary embodiment, a total of five pockets are located in the upper side of the susceptor 2 that is directed toward the process chamber 14. A substrate retaining element 3 with the shape of a circular disc is located in each pocket. One of the supply lines 8 leads into the bottom 6 of each pocket 5 such that the gas exiting the mouth of the supply line 8 forms a gas cushion 7, which on the one hand rotationally drives the substrate retaining element 3 and on the other hand lifts the substrate retaining element 3. At least one substrate 4 lies on the substrate retaining element and can be coated with at least one layer, particularly a semiconductor layer, in a deposition process within the process chamber. The process gases required for this purpose are fed into the process chamber 14 by means of a gas inlet element 12, wherein the process gases are introduced into the process chamber 14 from gas outlet zones 13. The process chamber 14 is upwardly delimited by a process chamber ceiling 11 that has an opening 17, through which an optical path 16 extends. The optical path 16 connects a measuring point 18 located approximately in the center of the substrate retaining element 3 to an optical temperature measuring element 15 such as a pyrometer, by means of which the surface temperature of the substrate 4 or the substrate retaining element 3 can be determined. In addition, index elements are provided in order to determine the rotating position of the susceptor 2. These pieces of information are fed to a control device 23. Based on these pieces of information, the control device 23 can determine which of the five substrate retaining elements 3 passes through the detection area of the temperature measuring element 15 at a certain point in time in order to successively measure the current temperatures (measured actual values Tn) of the substrate retaining elements 3.

The gas cushion, on which the substrate retaining elements 3 float, forms a heat transfer path in order to transfer heat from the susceptor 2 to the substrate retaining element 3. The heat transferred to the substrate retaining elements 3 depends on the height of the gas cushion such that the surface temperature of the substrate 4 can be varied by varying the height of the gas cushion.

A first closed-loop controller 21 uses the actual temperature values T1, T2, T3, T4, T5 measured with the temperature measuring element 15 for specifying the gas flows of the mass flow controllers 20 in such a way that the actual values T1, T2, T3, T4, T5 approach their average value MT.

In another embodiment, an arbitrary and universal nominal value can be used (e.g., a temperature difference from the susceptor bottom plate or from the process chamber ceiling).

Figure 4:
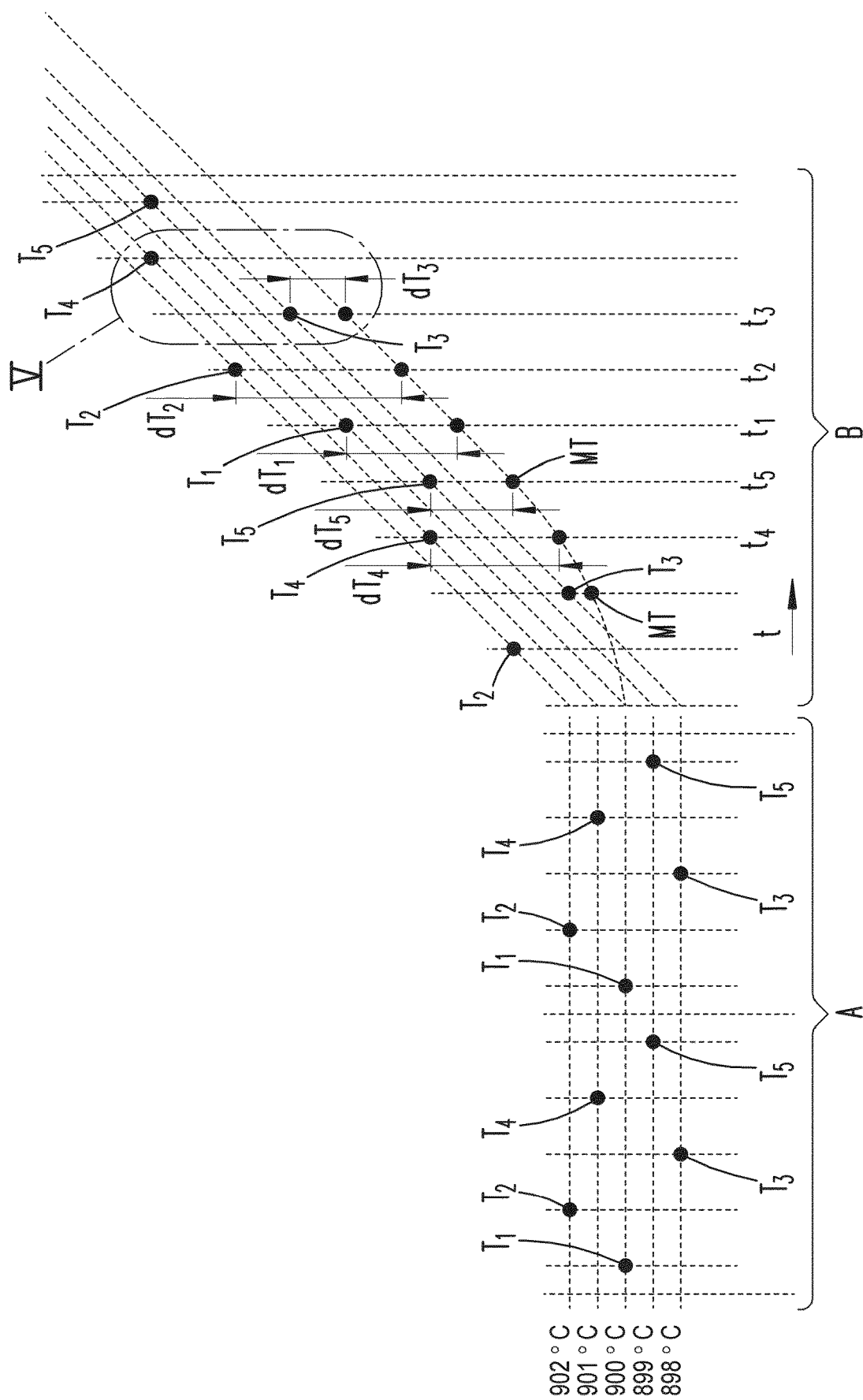
Figure 5:
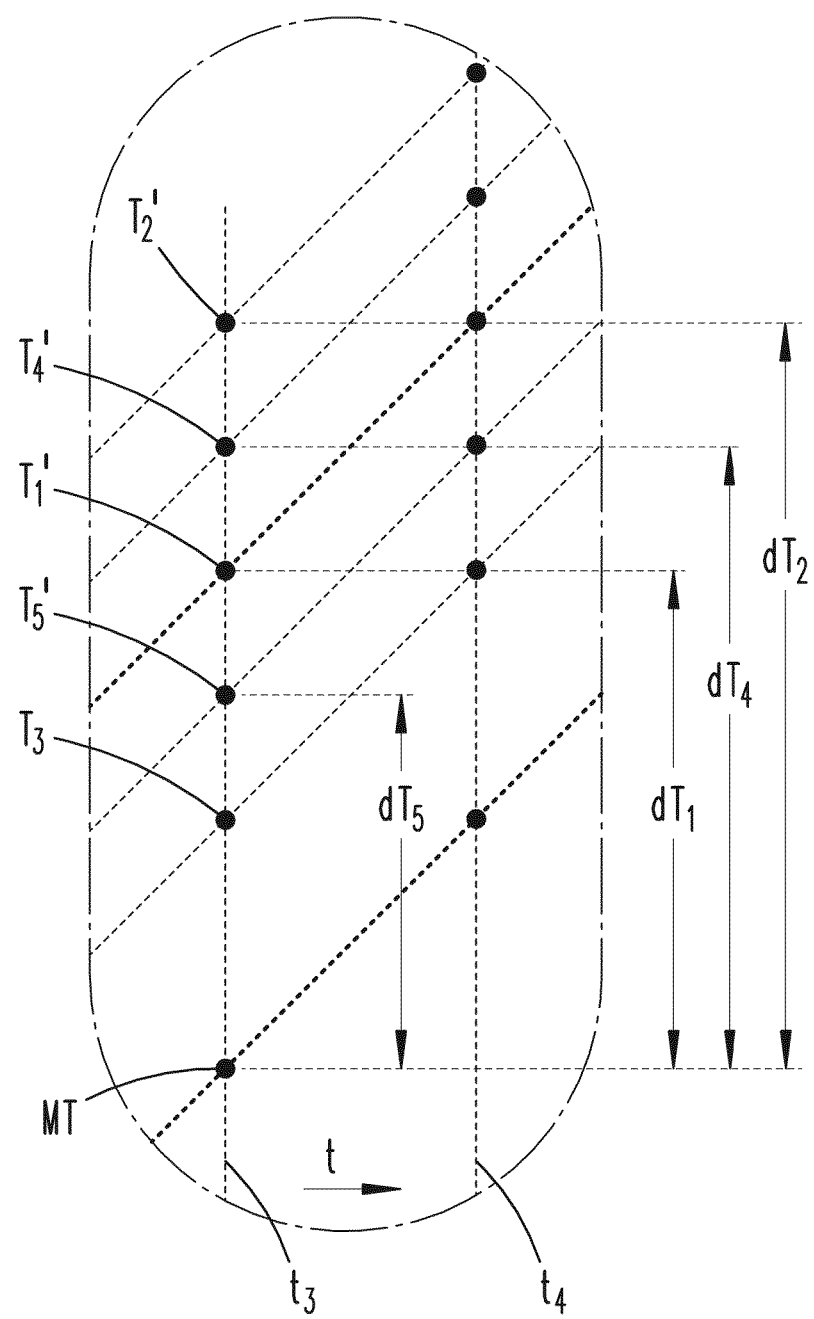
FIG. 5 shows an enlarged detail of FIG. 4 in order to elucidate the difference values dT1, dT2, dT3, dT4, dT5.

The method used for this purpose is described in greater detail below with reference to FIGS. 4 and 5, wherein the curves illustrated in FIGS. 4 and 5 show the resulting progression of the surface temperatures of the five substrate retaining elements when no closed-loop temperature control is carried out. The relative distances between the temperatures therefore remain unchanged over the entire length of the curves. In reality, the relative distances between the curves would be reduced due to the closed-loop control and ideally be zero. The susceptor temperature is not changed in a first phase A.

The susceptor 2 rotates about its axis with a constant rotational speed that may lie between two and twenty revolutions per minute. The intervals, between which individual measurements on substrate retaining elements 3 that successively pass through the detection area of the temperature measuring element 15 are carried out, accordingly have lengths of a few seconds. The temperatures T1, T2, T3, T4, T5 of the individual substrate retaining element surfaces do not change in the first phase A, during which the susceptor temperature is kept constant at approximately 900° C. If the excluded closed-loop control would actually be carried out, the temperatures T1, T2, T3, T4, T5 would approach an average value.

The susceptor temperature steadily increases in the second phase B, for example due to an increase of the heating power.

An average value MT is determined in each of the two phases A, B as follows:

$$MT(k)=\tfrac{1}{5}\cdot(T_1(k)+T_5(k-1)+T_4(k-2)+T_3(k-3)+T_2(k-4))$$

k={6, 11, 16, 21, . . . } for S=1, N=5

$$MT(k)=\tfrac{1}{5}\cdot(T_2(k)+T_1(k-1)+T_5(k-2)+T_4(k-3)+T_3(k-4))$$

k={7, 12, 17, 22, . . . } for S=1, N=5

$$MT(k)=\tfrac{1}{5}\cdot(T_3(k)+T_2(k-1)+T_1(k-2)+T_5(k-3)+T_4(k-4))$$

k={8, 13, 18, 23, . . . } for S=1, N=5

$$MT(k)=\tfrac{1}{5}\cdot(T_4(k)+T_3(k-1)+T_2(k-2)+T_1(k-3)+T_5(k-4))$$

k={9, 14, 19, 24, . . . } for S=1, N=5

$$MT(k)=\tfrac{1}{5}\cdot(T_5(k)+T_4(k-1)+T_3(k-2)+T_2(k-3)+T_1(k-4))$$

k={10, 15, 20, 25, . . . } for S=1, N=5
N: number of substrate carriers
S: position of the susceptor (wafer number) for k=1|S={1, 2, 3 . . . N}
Point in time of the measurement:

$$t(k) = \frac{60_{[s]}}{N\cdot \omega_{[rpm]}}\cdot k \mid k \in \mathbb{N}$$

ω: rotational frequency of the susceptor.
In the most general sense, the average value formation takes place as follows:

$$MT(k) = \frac{1}{N}\cdot \sum_{n=1}^{N} T_{(N-((n-k+N-S)\bmod N))}(k-n+1)$$

$$k\in \mathbb{N}, k>N, n\in\{1,2,3,4,\ldots,N\}$$

Modulo: n mod m results in the residual quantity b of the division n divided by m, the sign of b corresponds to the sign of m, wherein N is the total number of substrate retaining elements 3, which in the exemplary embodiment is equal to five.

The average value formation is carried out during each measurement, wherein the temperature value of the substrate retaining element 3 currently located in the detection area of the temperature measuring element 15 and otherwise the previously measured temperature values of all other substrate retaining elements are used, but wherein only one respective measured value and always only the most recent measured value is used. In the region of phase B, this leads to the average value being characterized by measured temperature values that were recorded in the past, i.e. at different substrate temperatures ST. FIG. 4 shows that the curve of the average value MT extends underneath the measured curve of the measured temperature values of the individual substrate retaining elements 3. A sharp bend in the measured curves in the illustration leads to a delayed gradient rise of the curve of the average value.

Not only a current actual value, but also a difference value is calculated during each measurement as follows:

$$dT1(k)=T1(k)-MT(k)|k=\{6,11,16,21,\ldots\} \text{ for } S=1, N=5$$

$$dT2(k)=T2(k)-MT(k)|k=\{7,12,17,22,\ldots\} \text{ for } S=1, N=5$$

$$dT3(k)=T3(k)-MT(k)|k=\{8,13,18,23,\ldots\} \text{ for } S=1, N=5$$

$$dT4(k)=T4(k)-MT(k)|k=\{9,14,19,24,\ldots\} \text{ for } S=1, N=5$$

$$dT5(k)=T5(k)-MT(k)|k=\{10,15,20,25,\ldots\} \text{ for } S=1, N=5.$$

In the most general sense, the difference value can be calculated as follows:

$$dT_{(N-((n-k+N-S)\bmod N))}(k)=T_{(N-((n-k+N-S)\bmod N))}(k)-MT(k)$$
$$|n=1.$$

The difference value at the points in time $t_4$, $t_5$, $t_1$, $t_2$ and $t_3$ are illustrated in FIG. 4. FIG. 5 shows how approximated temperatures T5', T1', T4' and T2' are calculated at the time $t_3$ based on the average value MT determined at the time $t_3$ by using the previously determined difference values $dT_1$, $dT_2$, $dT_4$, $dT_5$. The temperature T3 of the third substrate retaining element is measured at the point in time t3. The average value MT is initially calculated by using the actual temperature values T4, T5, T1, T2 measured previously at the points in time t4, t5, t1, t2, respectively. Approximated temperatures T5', T1', T4', T2' are calculated by using the difference values dT4, dT5, dT1, dT2 calculated at the points in time t4, t5, t1, t2 as follows.

$$T'1(k)=T1(k)|k=\{6,11,16,21,\ldots\} \text{ for } S=1, N=5$$

$$T'2(k)=MT(k)+dT2(k-4)$$

$$T'3(k)=MT(k)+dT3(k-3)$$

$$T'4(k)=MT(k)+dT4(k-2)$$

$$T'5(k)=MT(k)+dT5(k-1)$$

. . . .

In the most general sense, the approximated temperatures are calculated as follows:

$$T'_{(N-((n-k+N-S)\bmod N))}=MT(k)+dT_{(N-((n-k+N-S)\bmod N))}(k-n+1) k\in \mathbb{N}, k>N, n\in\{1,2,3,4,\ldots,N\}.$$

A second average value can then be calculated from the approximated temperatures Tn' as follows $$MT'(k) = \frac{1}{5}(T'_1(k)+T'_2(k)+T'_3(k)+T'_4(k)+T'_5(k))$$

or, in the most general sense, in accordance with $$MT'(k) = \frac{1}{N}\sum_{n=1}^{N} T'_n(k).$$

The respective closed-loop control or open-loop control of the mass flow controllers 20 is carried out with the aid of this second average value MT', which may correspond to the current susceptor temperature if this susceptor temperature rises with a constant gradient, wherein the closed-loop/open-loop control takes place in such a way that a difference between the approximated actual temperature T1' and the second average value MT' is controlled toward zero in a closed-loop manner.

FIG. 6 shows how the temperatures change on a temperature ramp in the form of a table.

The preceding explanations serve for elucidating all inventions that are included in this application and respectively enhance the prior art independently with at least the following combinations of characteristics, wherein two, multiple or all of these combinations of characteristics may also be combined with one another, namely:

A method, which is characterized in that an approximated actual value Tn', which is used for the open-loop/closed-loop control, is determined after each measurement of a measured actual value Tn of the surface temperature associated with a substrate retaining element 3 by using the last-measured actual value Tn of the surface temperature of at least one other substrate retaining element 3.

A method, which is characterized in that a first value MT is calculated with the actual values Tn of the surface temperature of a plurality of other substrate retaining elements 3 or each substrate retaining element 3 and/or in that the first value MT is an average value MT of the last-measured actual values Tn of the surface temperatures and/or in that a difference value dTn associated with the substrate retaining element 3 is calculated by forming a difference between the actual value Tn measured during the measurement and the first value or average value MT and/or in that the approximated actual value Tn' is calculated for each of the other substrate retaining elements 3 by respectively adding the associated difference value dTn to the value MT.

A method, which is characterized in that the substrate retaining element is a substrate retainer 3, which is supported by a dynamic gas cushion, and in that the parameter is the height of the gas cushion 7 or a composition of the gas forming the gas cushion 7 and/or in that the parameter is a cooling or heating power supplied to a substrate retaining element 3.

A method, which is characterized in that a second average value MT' is calculated after a or each measurement by using the actual value Tn determined during the measurement and the last-calculated approximated actual values Tn' associated with one, a few or all of the other substrate retaining elements 3, and in that the difference between the approximated actual value Tn' and the second average value MT' is used as input variable for a first closed-loop controller 21, which controls the difference toward zero in a closed-loop manner.

A method, which is characterized in that the susceptor 2 is heated from a first temperature to a second temperature with steadily increasing temperature by means of a heating device 9 or cooled to a second temperature with steadily decreasing temperature, and in that actual values are in the process cyclically measured in successive intervals on a number of substrates 4 that are associated with the susceptor 2 and respectively lie on one of the substrate retaining elements 3.

A method, which is characterized in that a susceptor temperature, the first or second average value or one of the approximated actual values Tn' is controlled toward a nominal value in a closed-loop manner with a second closed-loop controller 22.

A method, which is characterized in that the susceptor 2 used has the shape of a circular disk and is arranged in a process chamber 14 of a CVD reactor, wherein the substrate retaining elements 3 are arranged on said susceptor on a circular arc line about a center of the susceptor 2, about which the susceptor 2 is rotated, and wherein the measured actual value of the surface temperature is determined at a position 18 within the process chamber 14 by means of a temperature measuring element 15.

A CVD reactor, which is characterized in that the control device 23 is designed in such a way that a value MT is determined after each measurement of a measured actual value of the surface temperature associated with a substrate retaining element 3 by using the last-measured actual value Tn of the surface temperature of one or each substrate retaining element 3, in that a difference value dTn associated with the substrate retaining element 3 is calculated by forming a difference between the actual value Tn measured during the measurement and the value MT, and in that an approximated actual value Tn', which is used for the open-loop/closed-loop control, is calculated for at least one other substrate retaining element 3 by adding the associated difference value dTn to the value MT.

A CVD reactor, which is characterized in that a first value MT is calculated with the actual values Tn of the surface temperature of a plurality of other substrate retaining elements 3 or each substrate retaining element 3 and/or in that the first value MT is an average value MT of the last-measured actual values Tn of the surface temperatures and/or in that a difference value dTn associated with the substrate retaining element 3 is calculated by forming a difference between the actual value Tn measured during the measurement and the first value or average value MT and/or in that the approximated actual value Tn' is calculated for each of the other substrate retaining elements 3 by respectively adding the associated difference value dTn to the value MT.

A CVD reactor, which is characterized in that a second average value MT' is calculated after a or each measurement by using the actual value Tn determined during the measurement and the last-calculated approximated actual values Tn' associated with one, a few or all of the other substrate retaining elements 3, and in that the difference between the approximated actual value Tn' and the second average value MT' is used as input variable for a first closed-loop controller 21, which controls the difference toward zero in a closed-loop manner.

A CVD reactor, which is characterized in that the susceptor 2 is heated from a first temperature to a second temperature with steadily increasing temperature by means of a heating device 9 or cooled to a second temperature with steadily decreasing temperature, and in that actual values are in the process cyclically measured in successive intervals on a number of substrates 4 that are carried by the susceptor 2 and respectively lie on one of the substrate retaining elements 3.

A CVD reactor, which is characterized in that a susceptor temperature or the first or second average value is controlled toward a nominal value in a closed-loop manner with a second closed-loop controller 22.

All disclosed characteristics are essential to the invention (individually, but also in combination with one another). The disclosure of the associated/attached priority documents (copy of the priority application) is hereby fully incorporated into the disclosure content of this application, namely also for the purpose of integrating characteristics of these documents into claims of the present application. The characteristics of the dependent claims also characterize independent inventive enhancements of the prior art without the characteristics of a claim to which they refer, particularly for submitting divisional applications on the basis of these claims. The invention specified in each claim may additionally comprise one or more of the characteristics that were disclosed in the preceding description and, in particular, are identified by reference symbols and/or included in the list of reference symbols. The invention also concerns design variations, in which individual characteristics cited in the preceding description are not realized, particularly as far as they are obviously dispensable for the respective intended use or can be replaced with other, identically acting technical means.

LIST OF REFERENCE SYMBOLS

1 Housing
2 Susceptor
3 Substrate retaining element
4 Substrate
5 Pocket
6 Bottom
7 Gap, gas cushion
8 Supply line
9 Heating device
10 Shaft
11 Process chamber ceiling
12 Gas inlet element
13 Gas outlet zones
14 Process chamber
15 Temperature measuring element
16 Optical path
17 Opening
18 Measuring point
19 Gas source
20 Mass flow controller
21 First closed-loop controller
22 Second closed-loop controller
23 Control device
A First phase
B Second phase
dTn Difference value
dT1 Difference value
dT2 Difference value
dT3 Difference value
dT4 Difference value
dT5 Difference value
MT First average value
MT' Second average value
n Number
ST Susceptor temperature
Tn Actual value of surface temperature
Tn' Approximated actual value
T1 Surface temperature
T2 Surface temperature
T3 Surface temperature
T4 Surface temperature
T5 Surface temperature
T1' Approximated actual value
T2' Approximated actual value
T3' Approximated actual value
T4' Approximated actual value
T5' Approximated actual value
t1 Point in time
t2 Point in time
t3 Point in time
t4 Point in time
t5 Point in time

What is claimed is:

1. A method for controlling respective surface temperatures of substrates (4) that lie on substrate retaining elements (3) associated with a susceptor (2) disposed in a process chamber (14) of a chemical vapor deposition (CVD) reactor, wherein the susceptor (2) comprises a circular disk shape, wherein the substrate retaining elements (3) are arranged on said susceptor (2) on a circular arc line about a center of the susceptor (2), about which the susceptor (2) is rotated, the method comprising:

rotating the susceptor (2) about the center of the susceptor (2);

during the rotation of the susceptor (2) about the center of the susceptor (2), passing the substrate retaining elements (3) one after another through a detection area (18) of a temperature measuring element (15);

successively measuring, by the temperature measuring element (15), actual values of surface temperatures associated with the substrate retaining elements (3) while each substrate retaining element (3) passes through the detection area (18), the actual values including a last measured actual value associated with a last measured one of the substrate retaining elements (3);

calculating a current average value based on the last measured actual value and the actual values associated with a first group of the substrate retaining elements (3) excluding the last measured substrate retaining element (3) which have been measured prior to the last measured actual value;

calculating a difference value associated with the last measured substrate retaining element (3) by forming a first difference between the current average value and the last measured actual value;

for each additional actual value that is measured, repeating the calculation of the current average value and the calculation of the difference value associated with the last measured substrate retaining element (3) in which the additional actual value that is measured is designated as the last measured actual value;

calculating, for each of the substrate retaining elements (3) in the first group, an approximated actual value by adding a last computed difference value associated with the substrate retaining element (3) to the current average value; and utilizing the approximated actual values for controlling the respective surface temperatures of the substrates (4) to a common value in a closed-loop manner by varying a parameter.

2. The method of claim 1,
wherein each of the substrate retaining elements (3) is a substrate retainer that is carried by a gas cushion (7), and
wherein the parameter is a height of the respective gas cushions (7) or a composition of gas forming the respective gas cushions (7).

3. The method of claim 1, wherein the parameter is a cooling or heating power supplied to one or more of the substrate retaining elements (3).

4. The method of claim 1, further comprising:
calculating an approximated average value based on the last measured actual value and the one or more approximated actual values; and
calculating, for each of the one or more approximated actual values, a second difference between the approximated actual value and the approximated average value, wherein the second difference is used as an input variable for a first closed-loop controller (21), which controls the second difference toward zero in the closed-loop manner.

5. The method of claim 4, wherein one or more of a temperature of the susceptor (2), the current average value, the approximated average value or the one or more approximated actual values is controlled toward a nominal value in the closed-loop manner with a second closed-loop controller (22).

6. The method of claim 1, wherein the susceptor (2) is heated from a first temperature to a second temperature with steadily increasing temperature by a heating device (9) or cooled from the first temperature to a third temperature with steadily decreasing temperature.

7. The method of claim 1, wherein the actual values associated with the substrate retaining elements (3) in the first group comprise last-measured values for each of the substrate retaining elements (3) in the first group.

* * * * *